United States Patent [19]
Kobayashi et al.

[11] Patent Number: 5,144,129
[45] Date of Patent: Sep. 1, 1992

[54] ELECTRON MICROSCOPE

[75] Inventors: Hiroyuki Kobayashi, Mito; Koichi Kanaya, Mitaka; Norio Baba, Tokyo; Mitsuo Ogasawara, Katsuta, all of Japan

[73] Assignee: Hitachi, Ltd., Tokyo, Japan

[21] Appl. No.: 630,843

[22] Filed: Dec. 20, 1990

[30] Foreign Application Priority Data

Dec. 25, 1989 [JP] Japan .................. 1-332753

[51] Int. Cl.⁵ .............................................. H01J 37/07
[52] U.S. Cl. ................................... 250/307; 250/310; 250/311
[58] Field of Search .................. 250/310, 311, 307

[56] References Cited

U.S. PATENT DOCUMENTS

| | | | |
|---|---|---|---|
| 4,695,725 | 9/1987 | Mori et al. | 250/311 |
| 4,803,358 | 2/1989 | Kato et al. | 250/310 |
| 4,818,873 | 4/1989 | Herriot | 250/310 |

FOREIGN PATENT DOCUMENTS 332140 9/1989 European Pat. Off. .
61-237354 10/1986 Japan .
2123582 2/1984 United Kingdom .

*Primary Examiner*—Bruce C. Anderson
*Attorney, Agent, or Firm*—Antonelli, Terry Stout & Kraus

[57] ABSTRACT

An electron microscope comprising an electron gun for generating an electron beam, an irradiation lens system for irradiating a specimen with the electron beam, means for obtaining an image signal of the specimen, a frame memory for storing the image signal, means for obtaining a total accumulation function, which indicates the sum total of accumulated values in a plurality of one-dimensional directions, and in which each of the accumulated values in the plurality of one-dimensional directions indicates accumulation with respect to a frequency of a function obtained by applying one-dimensional Fourier transform to a function obtained by projecting two-dimensional intensity distribution of said image signal in corresponding one-dimensional direction thereof, and means for obtaining a substantial extreme point of the total accumulation function.

6 Claims, 4 Drawing Sheets

ELECTRON MICROSCOPE

BACKGROUND OF THE INVENTION

The present invention relates to an electron microscope, and more particularly to an electron microscope which is improved in point of correction of focusing and/or astigmatism.

Optimum focusing and astigmatism correction are required in an electron microscope in order to observe and photograph an image of high resolution (an image of high magnification). However, manipulation, thereof is very difficult and requires skill. Desire for an effective automatic focusing and automatic astigmatism correction device has increased in recent years in order to reduce the burden on the operator, and several techniques have been proposed.

One of these techniques is to examine by utilizing covariance of an image obtained with an electron microscope to determine characteristics of the image as a function of focal aberration quantity or astigmatism quantity, thereby to conduct automatic focusing and automatic astigmatism correction (Journal of Microscopy, Vol. 127, Pt Z, August 1982, pp. 185-199). Further, another technique is to achieve a similar object utilizing the observation quantity of an image produced by inclining an irradiation beam (Ultramicroscopy 21 (1987) 209-222)).

In either case, however, practical use has been difficult particularly in a transmission type electron microscope because of detection sensibility, following problems in high magnification and so on. Namely, in a high magnification of a transmission type electron microscope, phase contrast becomes a problem and the configuration of a fine structure which is an object of observation is different depending on focal aberration quantity. Thus, since focusing while watching the frequency characteristic of an image is indispensable, it has been difficult to determine a proper focus point. In another example, a method of measuring aberration quantity of a focal point and astigmatism quantity by the result of applying two-dimensional Fourier transform to an image obtained with an electron microscope is presented (Micron 1981, Vol. 12, pp. 105-121). In still another example, a two-dimensional image is projected in one-dimension thereby to apply one-dimensional Fourier transform thereto for the purpose of improvement of processing speed and economization of a memory area in place of two-dimensional Fourier transform, which may be effective in focusing and astigmatism correction (Scanning Microscopy, Vol. 1, No. 4, 1987, pp. 1507-1514).

However, the above-described last two examples are confined to obtaining information such as focal aberration quantity and coefficient of astigmatism or to comparing an image with Fourier transform by applying two-dimensional or one-dimensional Fourier transform, and it is neither considered nor mentioned how a current of a focusing electron lens and a correction current of an astigmatism correction device are controlled in performing automatic focusing or automatic astigmatism correction.

SUMMARY OF THE INVENTION

It is an object of the present invention to provide an electron microscope which is suitable for performing focusing and/or astigmatism correction automatically.

It is another object of the present invention to provide an electron microscope which is suitable for performing focusing and/or astigmatism correction efficiently.

According to the present invention, there is provided an electron microscope comprising means for generating an electron beam, means for irradiating a specimen with the electron beam, means for obtaining an image signal of the specimen, a frame memory for storing the image signal, and means for obtaining a total accumulation function, which indicates the sum total of accumulated values in a plurality of one-dimensional directions, and in which each of the accumulated values in the plurality of one-dimensional directions indicates accumulation with respect to a frequency of a function obtained by applying one-dimensional Fourier transform to a function obtained by projecting two-dimensional intensity distribution of the image signal in corresponding one-dimensional direction thereof, and for obtaining a substantial extreme point of the total accumulation function.

Other objects and features of the present invention will be apparent from the following description with reference to the drawings.

DESCRIPTION OF THE PREFERRED EMBODIMENTS

According to a preferred embodiment of the present invention, a two-dimensional intensity distribution of an electron microscope image is projected in a certain one-dimensional direction, a viz. accumulated only in one direction of a certain circular field of the image, one-dimensional Fourier transform is applied to the accumulated values, and the functions after Fourier transform are accumulated with respect to a frequency. Such a processing is repeated in various one-dimensional directions in the certain circular field, and the sum total of the integrated values after Fourier transform that are obtained in those one-dimensional directions, i.e. a mean value is obtained. Direction-change for such accumulation, i.e., averaging may be achieved easily by rotating the specimen.

Figure 1:
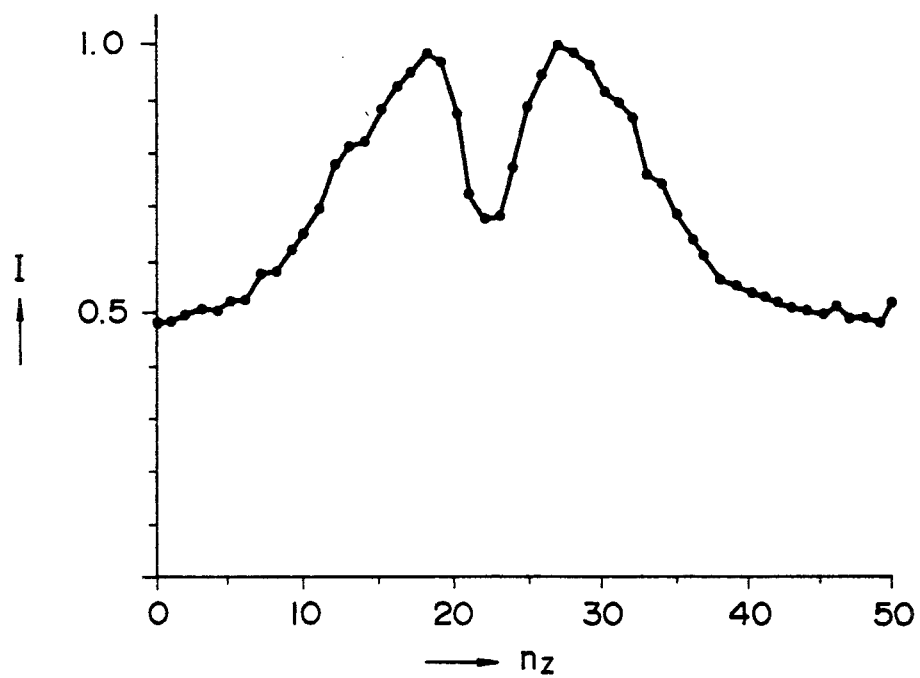
FIG. 1 is a graph showing the relationship of the total accumulated value I of an image signal with respect to the number of times $n_Z$ of changing a focal point of an electron beam which determines the focal point.

When it is assumed that the sum total, i.e. a mean value thus derived is I, and $N_z$ is the number of times of changing a focal point of an electron beam irradiating the specimen by $\Delta_Z$ at a time n, it has been found through experiments that I appears as shown in FIG. 1 against n. In FIG. 1, however, 1.0 is shown as the maximum value along the ordinate, i.e. 1 is normalized. The data in FIG. 1 is obtained in such a manner that only signals in a certain frequency range are obtained by applying signals after Fourier transform by projected values (accumulated values) in $N_z$ 24 directions at intervals of $\Delta_Z$ 15° to a band-pass filter and these signals are accumulated further. Namely, when it is assumed that the value obtained by accumulating the functions subjected to one-dimensional Fourier transform in a range of 12% to 56% of the maximum frequency with respect to a space frequency at a certain rotation angle $\theta_i$ is $\int q^2_{q1} I(q) \, q \, dq$, FIG. 1 shows the total accumulation function:

$$I = \sum_i^N \left( \int_{q1}^{q2} I(q) \cdot q \, dq \right) \Delta\theta$$

where, $\Delta\theta = \pi/N$, $N=24$ and q is a space frequency.

The position of a local minimum value is located approximately at a central position of symmetry of the function curve in FIG. 1, but is has been found that the contrast is substantially minimum locally at this position. As known, the contrast becomes minimum locally at a proper focus position in a transmission type electron microscope image (the contrast becomes maximum locally at a proper focus position in a scanning type electron microscope image). Accordingly, the center position of symmetry in FIG. 1, i.e., the position of the local minimum value is the regular focal position.

Figure 2:
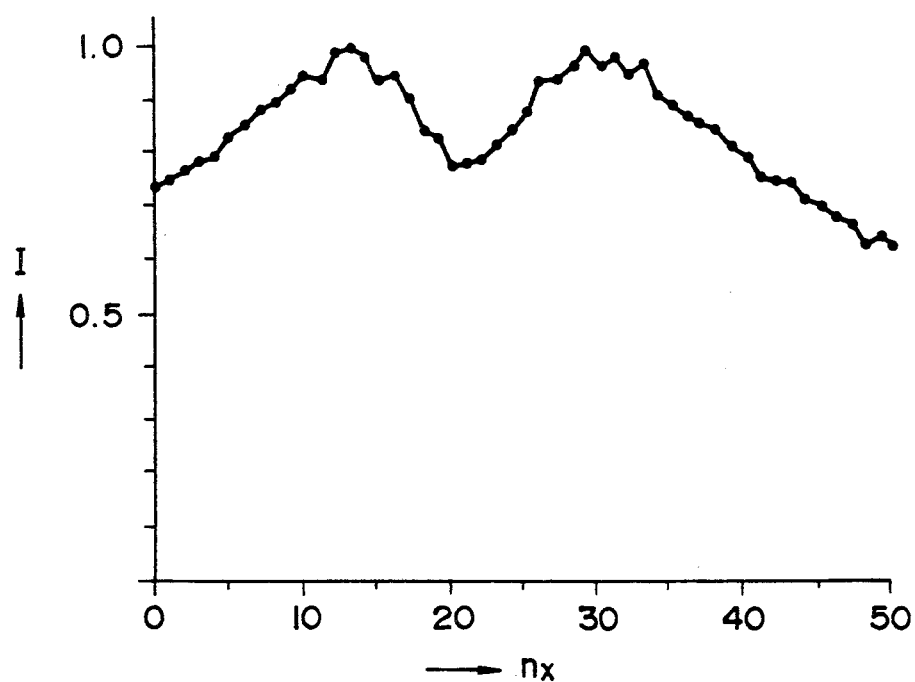
FIG. 2 is a graph showing the relationship of the total accumulated value I of an image signal with the number of times $n_X$ of changing a focal point of an electron beam in X-direction.

FIG. 2 shows data showing the relationship of I with $n_X$ which is similar to FIG. 1, when $N_x$ is the number of times of changing the focal point of an electron beam in the X-direction by $\Delta A_X$ at a time. In FIG. 2, the position of a local minimum value, i.e., a center position of symmetry is a position where the astigmatism quantity becomes minimum. The relationship of I with $n_Y$ when the number of times of changing the focal point of an electron beam in Y-direction by $\Delta A_Y$ at a time is $n_Y$ is similar to that shown in FIG. 2. In this case, the position of the local minimum value, i.e., the center position of symmetry is also a position where the astigmatism quantity becomes minimum.

Focusing can be achieved automatically in such a manner that I shown in FIG. 1 is obtained for every change by changing an exciting current of an electron lens which determines a focal point by a fixed quantity at a time, a center position of symmetry showing a local minimum value of the curve I is obtained, and the exciting current value at that position is set as the exciting current of the electron lens.

Astigmatism can be corrected automatically in a similar manner by obtaining I shown in FIG. 2 for every change by changing a correction current of an astigmatism correction device by a fixed quantity at a time, obtaining a center position of symmetry showing a local minimum value of the curve I, and setting a correcting current value at that position as the correcting current of the astigmatism correction device.

Figure 3:
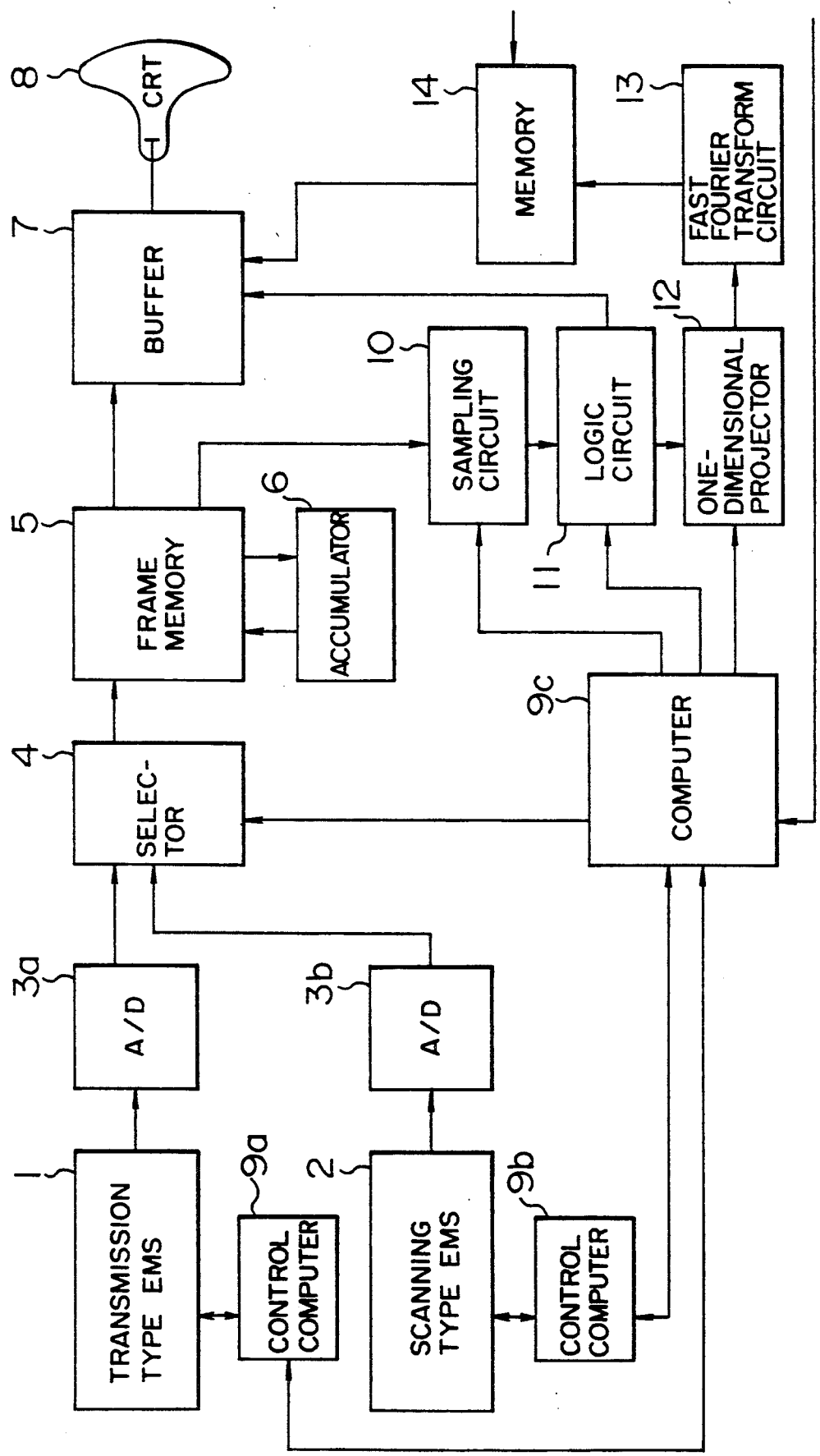
FIG. 3 is a block diagram of the whole system of an electron microscope showing an embodiment according to the present invention.

Now, referring to FIG. 3, selection of a transmission type electron microscope 1 and a scanning type electron microscope 2 is made with a selector 4. In the former case, a final image is formed on a transmission type fluorescent plate, and this image is picked up using a TV camera and converted into an electrical signal, and is taken into a frame memory (RAM) 5 as an image signal through an A/D converter 3a. In the latter case, an image signal in a direct TV mode or an image signal by slow scanning is taken into the frame memory (RAM) 5 through an A/D converter 3b. The input images are accumulated by means of an accumulator 6 as needed for the purpose of removing noise, and the values are stored in the frame memory 5 as a still image.

A reference numeral 7 denotes a buffer (VIDEO RAM) for displaying an image on a CRT 8, in which image data which is taken into the frame memory 5 or processed is stored, and this data is displayed on the CRT 8. A circular image having a vector direction designated by a sampling circuit 10 and enlargement or reduction factor and center position of a designated image is sampled from images in the frame memory 5. Such designation is made by a computer 9c. For the sampled image, window processing is executed by a logical circuit 11 for the purpose of removing artefacts by an edge portion of the image. Then, the image is projected in a one-dimensional direction by means of a one-dimensional projector 12. Namely, image data in the form of two-dimensional arrays are accumulated in a column or row direction and projected as one-dimensional data in the one-dimensional projector. The data projected in the one-dimensional direction is applied to a one-dimensional fast Fourier transform circuit, and computed, data (frequency spectrum) is stored in a memory 14 for display on the CRT similarly to the input image. Further, it is possible to read the spectrum any time by means of the computer 9c.

Here, focal points of taken-in images are made variable, viz., the current of focusing electron lenses is controlled by means of respective control computers 9a and 9b in the transmission type electron microscope 1 and the scanning type electron microscope 2, and the control computers 9a and 9b are connected with a computer 9c by communication. Further, respective computers 9a and 9b also control the exciting current of the astigmatism correction device. Thus, it is possible to control focal points and astigmatism correction of the transmission type electron microscope 1 and the scanning type electron microscope 2 by the instructions of the computer 9c.

In the construction described above, automatic focus point or astigmatism correction will be described hereafter. The exciting current of an electron lens or an astigmatism device which determines a focal point is varied by $\Delta Z$ or $\Delta A_n$ and $\Delta A_Y$ at a time, and a value I is obtained each time by accumulating the functions after one-dimensional Fourier transform obtained as described above, thus obtaining curves as shown in FIG. 1 or FIG. 2. $n_Z$ or $n_X$ and $n_Y$ where a cross-correlation function W(y) such as shown in the following expression becomes the maximum are obtained from these curves, and respective currents are set taking the position thereof as a proper focus position or a position where astigmatism correction becomes the minimum.

$$W(y) = \int_{-\infty}^{\infty} [I(z) - \bar{I}] \cdot |I(y-z) - \bar{I}| dZ$$

Here, when it is assumed that Z is $n_z \times \Delta Z$, $n_X \times \Delta A_X$ and $n_Y \times \Delta A_Y$, and $\bar{I}$ is a mean value of I, and the center of symmetry is Z' (or $A_X'$ and $A_Y'$), W(y) becomes the maximum when $u = 2Z'$ (or $2A_x'$, $A_Y'$).

By obtaining $n_Z$, $n_X$ and $n_Y$ with the steps of procedures described above and setting a focus current and an astigmatism correction current by communication, it is possible to correct the focus point or astigmatism automatically.

In case there is astigmatism, the accumulated value I of the functions after one-dimensional Fourier transform is different by a great margin with respect to every rotation of the image. With this, it is only required to correct astigmatism so that the maximum value $I_{max}$ and the minimum value $I_{min}$ are almost equal to each other. Here, astigmatism may also be corrected so that $\xi$ becomes the minimum, where $\xi = (I_{max} - I_{min})/I_{mean}$. $I_{mean}$ indicates the mean value of accumulated values with respect to every rotation.

Similarly, when there is astigmatism, space frequency components of a function after one-dimensional Fourier transform are different with respect to every rotation. Accordingly, astigmatism correction can be made automatically similarly to that described above by also making astigmatism correction so that $\xi = (l_{max} - l_{min})/l_{mean}$ becomes the minimum with the range 1 of space frequencies where values of respective functions become a certain fixed value and more, the maximum value $l_{max}$ of l, the minimum value $l_{min}$ of l, and a mean value $l_{mean}$ of l with respect to every rotation.

Figure 4:
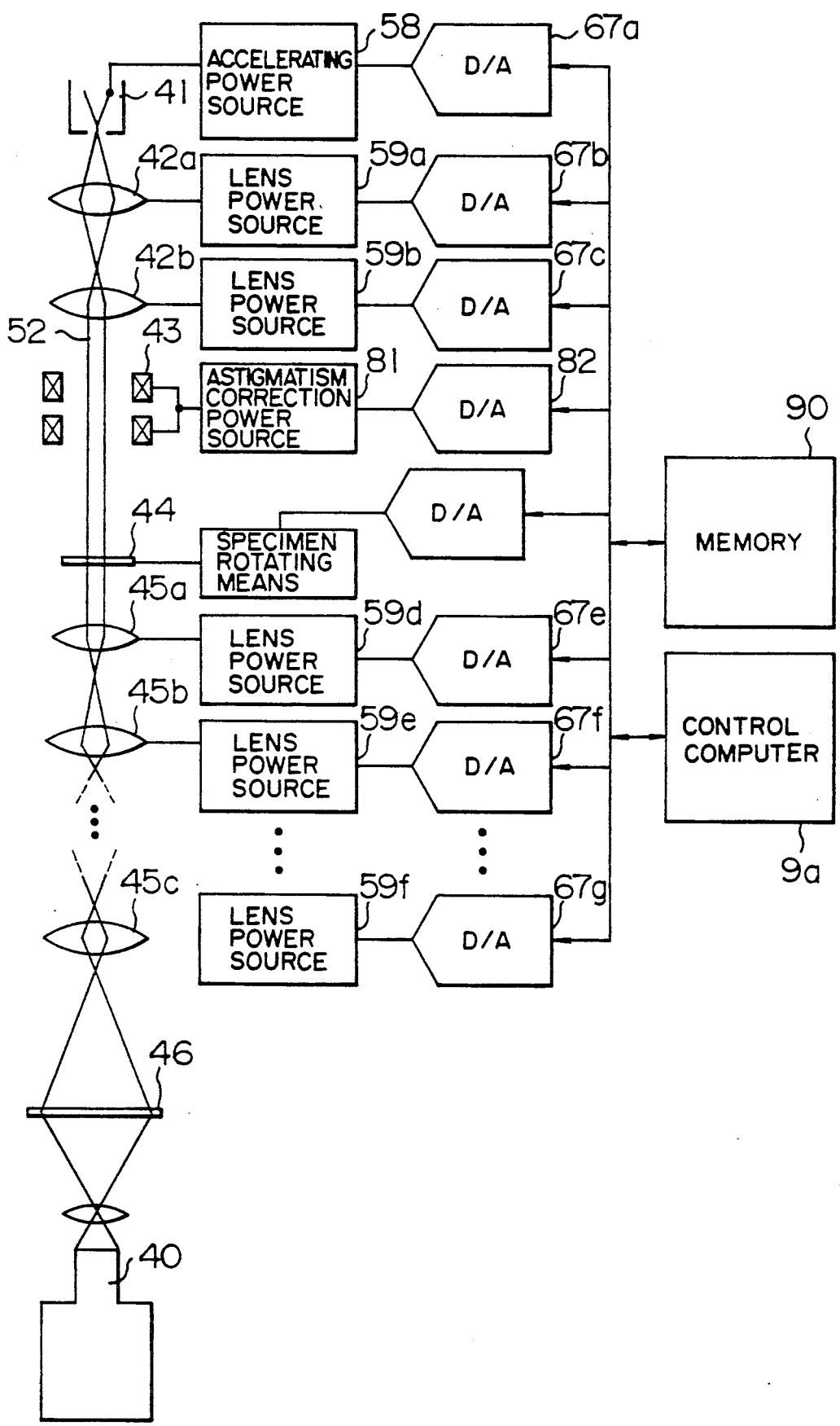
FIG. 4 is a conceptual diagram of a transmission type electron microscope shown in FIG. 3.

Referring to FIG. 4, an electron beam 52 emitted from an electron gun 41 is converged by means of an irradiation lens system 42 and irradiates a specimen 44. The electron beam which has transmitted through the specimen 44 forms an image on a fluorescent plate 46 by an image-forming lens system 45. A formed final image is picked up by a TV camera 40. The astigmatism of the electron beam 52 irradiating the specimen is corrected by an astigmatism correction device 43.

An accelerating power source 58 is connected to the electron gun 41, a lens power source 59 is connected to the lens system, and a power source 81 is connected to the astigmatism correction device 43, respectively. These power sources are controlled by a computer 9a through D/A converters 67 and 82. A specimen rotating device 93 which rotates the specimen 44 is provided and is controlled by a computer 9a through a D/A converter 94. Besides, 90 denotes a memory composed of a ROM and a RAM.

Figure 5:
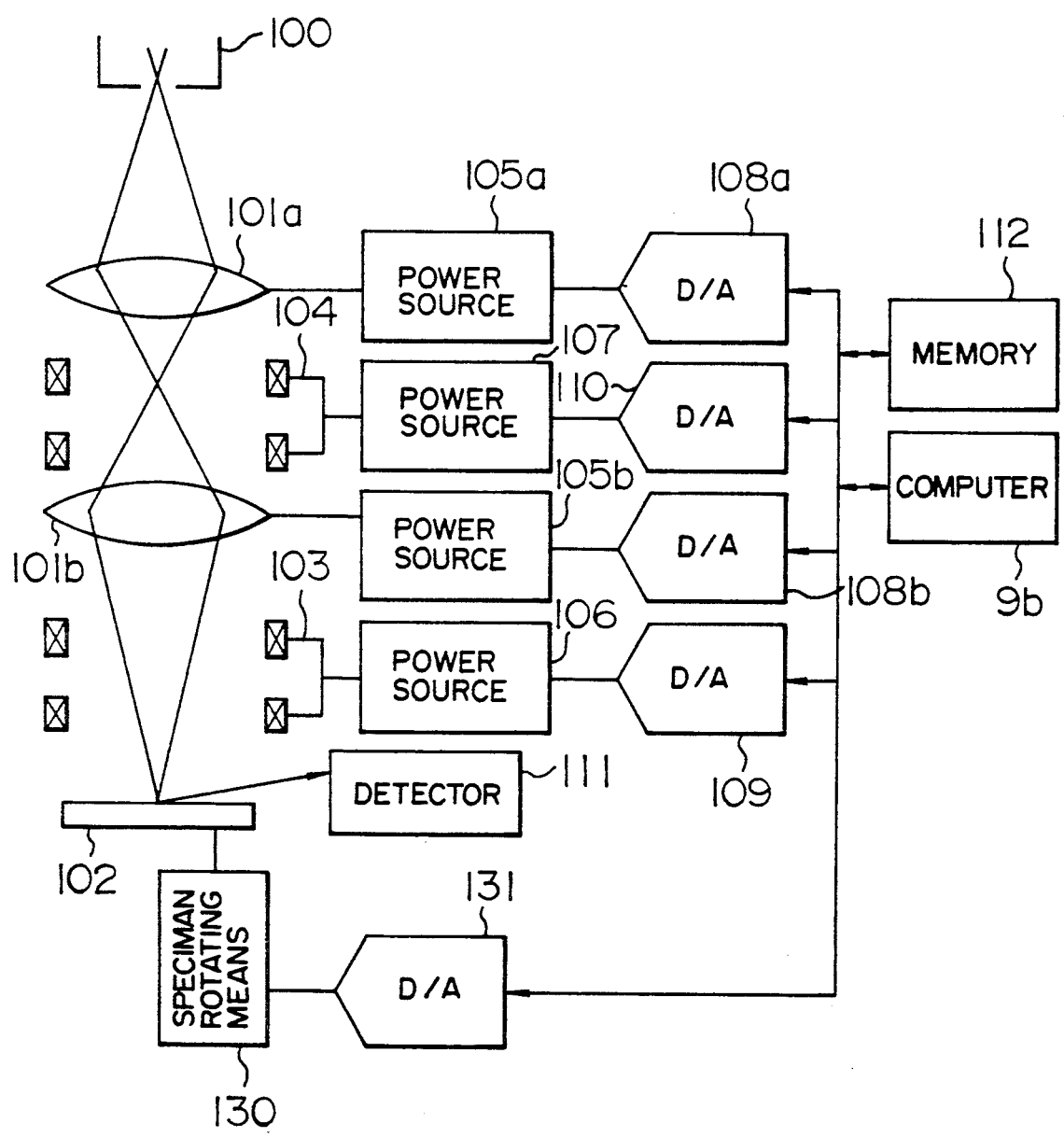
FIG. 5 is a conceptual diagram of a scanning type electron microscope shown in FIG. 3.

Referring to FIG. 5, an electron beam emitted from an electron gun 100 is converged by a convergent lens system 101 and irradiates a specimen 102. The electron beam irradiating the specimen 102 is deflected two-dimensionally on the specimen 102 by means of an electron beam deflecting device 103. The astigmatism of the electron beam irradiating the specimen 102 is corrected by an astigmatism correction device 104. Power sources 105, 106 and 107 are connected to the convergent lens system 101, the deflecting device 103 and the astigmatism correction device 104, respectively. These power sources are controlled by means of a computer 9b through D/A converters 108, 109 and 110.

Secondary electrons are generated from the specimen, and are detected by means of a secondary electron detector 111. The output signal of this detector is input to the frame memory 5 through the A/D converter 3b (FIG. 3). Besides, 112 denotes a memory composed of a ROM and a RAM. A specimen rotating device 130 which rotates the specimen 102 is provided, and is controlled by a computer 9b through a D/A converter 131.

We claim:

1. A method of focusing adjustment/astigmatism correction of an electron microscope comprising the steps of:

(a) accumulating, in a predetermined one-dimensional direction, intensities in a two-dimensional intensity distribution of an image obtained by said electron microscope at a predetermined focal point;

(b) applying Fourier transform to an accumulated function obtained in step (a);

(c) accumulating functions after the Fourier transform of step (b) to obtain an accumulated value;

(d) changing the focal point of said electron microscope by a predetermined amount and repeating said steps (a) to (c) to obtain a curve of the accumulated values as a function of one of an amount of defocusing and an amount of astigmatism for different focal points; and (e) determining one of a proper focus position and a position of minimum astigmatism based on one of an extreme point and a substantial center position of symmetry of said curve of the accumulated values.

2. A method of focusing adjustment/astigmatism correction comprising the steps of:

(a) accumulating, in a predetermined one-dimensional direction, intensities in a two-dimensional intensity distribution of an image obtained by said electron microscope at a predetermined focal point;

(b) applying Fourier transform to an accumulated function obtained in step (a);

(c) accumulating functions after the Fourier transform of step (b) to obtain an accumulated value;

(d) rotating a portion of said image obtained by said electron microscope in a certain circular field by a predetermined angle about a center of the circular field, so as to perform the steps (a) to (c) for at least two different rotation angles;

(e) accumulating the accumulated values obtained in the step (c) for the different rotation angles so as to obtain one of a total accumulated value and a mean value;

(f) obtaining a curve of the total accumulated values as a function of the amount of defocusing or the amount of astigmatism; and (g) determining one of a proper focus position and a minimum amount position of astigmatism on the basis of said curve.

3. A method of focusing adjustment/astigmatism correction according to claims 1 or 2, further comprising the step of:

removing, after the step (b) values corresponding to one of lower order and higher order space frequencies of the transformed functions by passing the transformed functions through a bandpass filter.

4. A method of focusing adjustment/astigmatism correction according to claim 2, further comprising the steps of:

obtaining a maximum value Imax, a minimum value Imin, and a mean value of the accumulated values of the functions after the Fourier transform for each rotation;

obtaining a coefficient of astigmatism from the formula:

$$\xi = (Imax - Imin)/Imean; \text{ and}$$

correcting the astigmatism by making the coefficient of astigmatism $\xi$ minimum.

5. A method of focusing adjustment/astigmatism correction according to claim 4, further comprising the step of:

in obtaining the accumulated value for each rotation, removing values corresponding to lower order or higher order space frequencies of the transformed functions by passing the transformed functions through a bandpass filter.

6. A method of focusing adjustment/astigmatism correction according to claim 2, further comprising the steps of:

obtaining a maximum value of lmax, a minimum value lmin, and a mean value lmean of a range l of a space frequencies at which a value of each function of the functions after the one-dimensional Fourier transform for each rotation becomes a certain value or more;

obtaining a coefficient of astigmatism $\xi$ by the formula:

$$\xi = (lmax - lmin)/lmean: \text{ and}$$

correcting the astigmatism by making the coefficient of astigmatism $\xi$ minimum.

* * * * *